(12) United States Patent
Kim et al.

(10) Patent No.: US 7,560,331 B2
(45) Date of Patent: Jul. 14, 2009

(54) METHOD FOR FORMING A SILICIDED GATE

(75) Inventors: Hyun-Su Kim, Gyeonggi-Do (KR); Jong-Ho Yun, Gyeonggi-Do (KR); Sang-Woo Lee, Seoul (KR); Seok-Woo Jung, Gyeonggi-Do (KR); Eun-Ji Jung, Gyeonggi-Do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 436 days.

(21) Appl. No.: 11/354,748

(22) Filed: Feb. 14, 2006

(65) Prior Publication Data

US 2007/0026578 A1    Feb. 1, 2007

(30) Foreign Application Priority Data

Jul. 28, 2005  (KR)  .................. 10-2005-0068994

(51) Int. Cl.
*H01L 21/8238* (2006.01)
(52) U.S. Cl. .................. 438/230; 438/682; 438/664; 257/412; 257/413; 257/E21.199
(58) Field of Classification Search .................. None
See application file for complete search history.

(56) References Cited

U.S. PATENT DOCUMENTS

| | | | |
|---|---|---|---|
| 5,937,319 A | | 8/1999 | Xiang et al. |
| 6,174,762 B1 * | | 1/2001 | Bronner et al. ............. 438/230 |
| 6,534,390 B1 * | | 3/2003 | Chong et al. ................ 438/592 |
| 6,864,178 B1 * | | 3/2005 | Kim ........................... 438/692 |
| 2005/0037558 A1 | | 2/2005 | Gong et al. |

FOREIGN PATENT DOCUMENTS

| | | |
|---|---|---|
| JP | 62-137870 | 6/1987 |
| KR | 2003-0054274 | 7/2003 |
| KR | 2004-0054341 | 6/2004 |

OTHER PUBLICATIONS

W. R. Runyan, et al. "Semiconductor Integrated Circuit Processing Technology" Copyright © 1990 by Addison-Wesley Publishing Company, Inc. 6 pages.
Badih El-Kareh "Fundamentals of Semiconductor Processing Technology" Copyright © 1995 by Kluwer Academic Publishers, 14pages.
Jakub Kedziershi, Diane Boyd, et al. "Issues in NiSi-gated FDSOI device integration" IEEE 2003, 4 pages.
C. Cabral, Jr., Kedzierski, et al. "Dual Workfunction Fully Silicided Metal Gates" IEEE 2004 Symposium on VLSI Technology Digest of Technical Papers, pp. 184-185.

* cited by examiner

*Primary Examiner*—W. David Coleman
*Assistant Examiner*—Shaka Scarlett
(74) *Attorney, Agent, or Firm*—Marger Johnson & McCollom, P.C.

(57) ABSTRACT

A gate is silicided through its sides while limiting silicidation through the top of the gate. A blocking layer may be formed over the gate layer, and the sidewalls of the gate layer are exposed. A layer of metal is formed on the sidewalls of the gate and thermally treated to silicide the gate layer. The sidewalls of the gate maybe exposed through an etching process in which a silicide layer formed over the blocking layer is used as an etch mask.

23 Claims, 7 Drawing Sheets

METHOD FOR FORMING A SILICIDED GATE

CROSS-REFERENCE TO RELATED APPLICATIONS

This U.S. non-provisional patent application claims priority and benefit of Korean Patent Application 2005-0068994 filed on 28 Jul. 2005, the entire contents of which are hereby incorporated by reference.

BACKGROUND

FIG. 1 is a cross-sectional view of a conventional metal-oxide-semiconductor (MOS) transistor. The transistor is fabricated on a substrate 100 that is formed from a single crystal of semiconducting material, most commonly silicon. A gate structure 102 includes an insulating layer 104, a gate electrode 106, a mask (or cap) layer 108, and sidewall spacers 110. The insulating layer 104 is typically formed by growing a thin film of silicon oxide on the substrate 100. The gate electrode 106 is then formed by depositing a layer of conductive material over the oxide layer. The conductive material may be metal or doped polysilicon. The mask layer 108 and sidewall spacers 110 are formed from insulating materials such as silicon-oxide and silicon-nitride.

Source and drain regions 112 (also referred to as active regions) are then formed in the substrate on opposite sides of the gate structure. The source and drain regions 112 may be formed by ion implantation in which the substrate is bombarded with high energy impurity ions that penetrate into the substrate 100. During this process, the gate structure 102 acts as a mask and prevents ions from being implanted into the portion of the substrate under the gate structure. The transistor is then connected to other circuit elements through metal conductors, typically made from aluminum, that are arranged to form contacts with the gate electrode and the active regions.

The region of the substrate 100 directly under the gate structure between the source and drain is known as the channel region and is poorly conductive in its normal state. When a voltage is applied to the gate, the electrical conductivity of the channel region is enhanced, and current may flow between the source and drain to perform a useful function such as switching or amplification.

A typical integrated circuit (IC) chip may include millions of MOS transistors fabricated on a substrate that is part of a larger single crystal known as a wafer. Dozens of chips may be fabricated on a single wafer which is then cut into individual IC chips after the fabrication process is completed. As IC chips continue to increase in density and complexity, the dimensions of the transistor features such as the source, drain and gate must be reduced in order to pack more transistors onto a single chip. One technical challenge in reducing feature size is maintaining adequate electrical connections to the gate, source and drain of each transistor. As the feature size decreases, the contact area between the metal conductors and the silicon features decreases, and thus, the contact resistance increases.

To provide a more reliable contact through a smaller surface area, certain metals may be used to form contacts because they react with silicon to form silicides which provide a highly conductive and reliable contact. A silicide contact is typically formed by depositing a thin layer of metal over silicon regions where contacts are to be formed, and then thermally treating it to cause the silicon and metal to react and form a silicide. In some instances, for example, with a drain or source, only a portion of the silicon feature should be converted to silicide so as to preserve the semiconducting property of the remaining silicon. In other instances, for example, with a gate electrode, it may be advantageous to fully silicide the silicon to provide maximum conductivity.

One prior art technique for siliciding the gate of a MOS transistor attempts to silicide the entire gate electrode through the top surface gate. In this technique, a MOS transistor having a polysilicon gate is first fabricated in a conventional manner as shown in FIG. 1. Referring to FIG. 2, portions of the active regions are then silicided through a self-aligned silicide (salicide) process to form silicide contacts 114 for the source and drain 112. Lightly doped drain (LDD) regions 116 are formed on either side of the channel region to reduce the electric field strength near the edges of the gate and its accompanying adverse effects.

An insulating layer 118 of silicon-oxide or silicon-nitride is next formed over the entire substrate 100. A portion of the insulating layer 118 is then removed through a planarization process such as chemical mechanical polishing (CMP), along with the mask layer 108 and portions of the sidewall spacers 110 to expose the gate layer 106 as shown in FIG. 2. A thin layer of metal 120 such as titanim (Ti), cobalt (Co), or nickel (Ni) is deposited over the entire wafer, as shown in FIG. 3, and then thermally treated to cause the metal to react with the polysilicon and form a silicide layer 122. Unreacted metal on the surface of the protective layer is removed through an etching process.

Although much of the gate layer is silicided through this process, it may be difficult or impossible to fully silicide the gate layer because of the small contact area between the metal layer and the polysilicon gate. To provide more complete silicidation, another prior art technique exposes both the top and sides of the gate layer to the metal layer. This technique also begins by forming a MOS transistor having a polysilicon gate in a conventional manner. The gate layer 106 and active regions are then partially silicided through a salicide process to form silicide layers 124 as shown in FIG. 4. An insulating layer 126 is then deposited over the entire substrate 100. The insulating layer 126 and sidewall spacers 110 are etched to expose not only the top surface of the gate layer, but also portions of the sidewalls as shown in FIG. 5. Another metal layer 128 is formed over the top and sidewalls of the gate layer 106 as shown in FIG. 6, and the structure is thermally treated again to fully silicide the gate layer.

Although the process shown in FIGS. 4-6 may fully silicide the entire gate, it tends to produce a gate having unacceptable properties. For example, the corners of the gate layer may be rounded off, and the sidewalls may bulge outward. This makes further processing difficult, results in irregular device geometries, and may increase the parasitic capacitance between adjacent gate structures. This process may also create voids in the gate layer 106 as the polysilicon is consumed by the silicidation process, especially at the bottom of the gate layer 106 where it meets gate oxide layer.

SUMMARY

The inventive principles of this patent disclosure relate to siliciding a gate through its sides while limiting silicidation through the top of the gate. In one embodiment, a blocking layer may be formed over the gate layer, and the sidewalls of the gate layer are exposed. A layer of metal is formed on the sidewalls of the gate and thermally treated to silicide the gate layer. The sidewalls of the gate maybe exposed through an etching process in which a silicide layer formed over the blocking layer is used as an etch mask.

DETAILED DESCRIPTION

An embodiment of a method for forming a silicided gate according to the inventive principles of this patent disclosure is illustrated in FIGS. 7 through 16.

Figure 1:
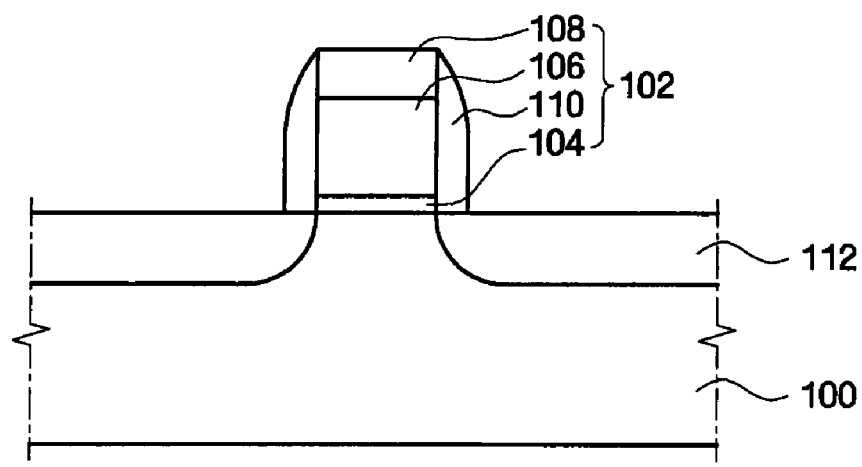
FIG. 1 illustrates a prior art MOS transistor.
Figure 2:
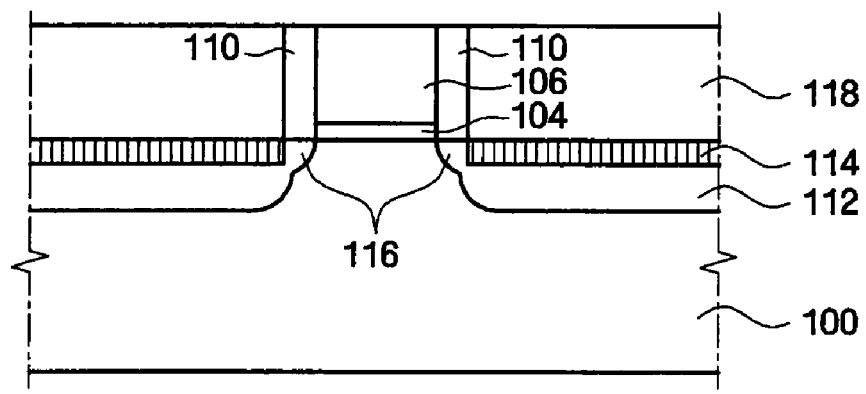
FIGS. 2 and 3 illustrate a prior art technique for siliciding the gate of a MOS transistor through the top surface of the gate.
Figure 3:
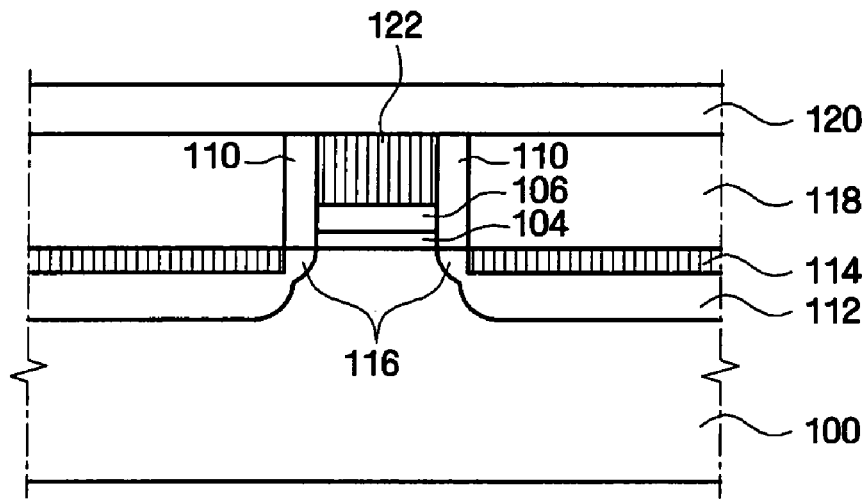
Figure 4:
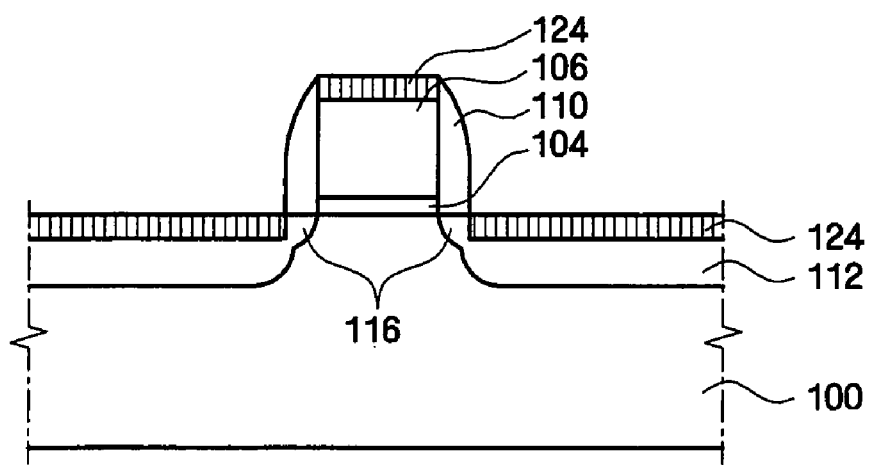
FIGS. 4 through 6 illustrate a prior art technique for siliciding the gate of a MOS transistor through the top surface and sidewalls of the gate.
Figure 5:
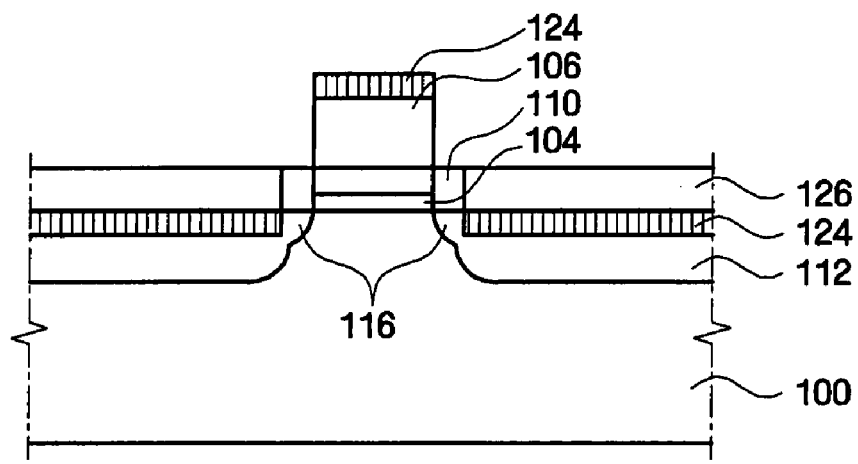
Figure 6:
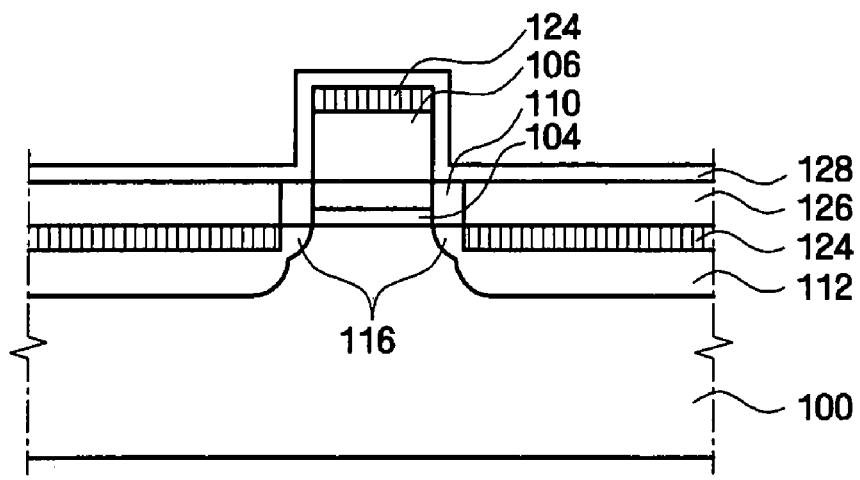
Figure 7:
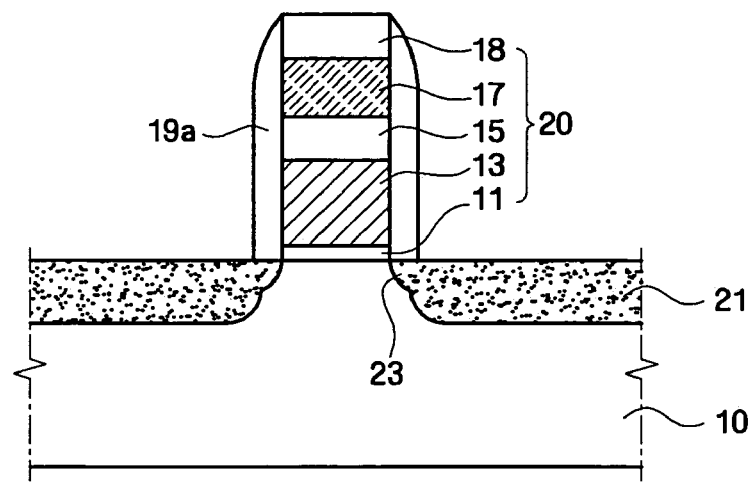
FIGS. 7 through 16 illustrate an embodiment of a method for forming a silicided gate according to the inventive principles of this patent disclosure.

Referring to FIG. 7, a gate structure 20 for a transistor is formed on a semiconductor substrate 10. The gate structure includes a gate insulating layer 11, a polysilicon gate layer 13, a first blocking layer 15, another polysilicon layer 17, a mask layer 18 and sidewall spacers 19a. The first blocking layer 15 may be anything that stops silicidation through the top of the gate layer 13. In this embodiment, the first blocking layer 15 may be a layer of silicon nitride ($Si_3N_4$) deposited to a thickness of, for example, about 300 to about 1000 angstroms (Å). The mask layer 18 may also be formed from silicon nitride.

Figure 8:
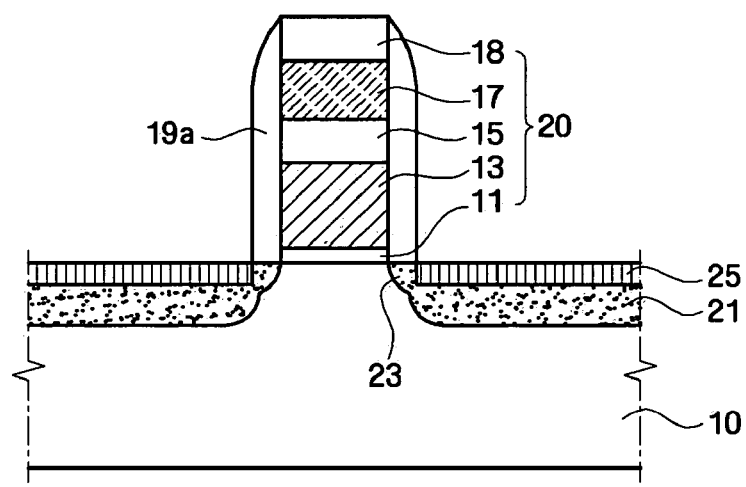

Once the gate structure 20 is formed, source and drain regions 21 (also referred to as active regions) are formed in the substrate 10 through ion implantation using the gate structure 20 to mask the channel region under the gate insulating layer 11. Lightly doped drain (LDD) regions 23 are also formed at either side of the channel region. A metal silicide layer 25 is then formed on the surface of the source and drain regions 21 through a salicide (self-aligned silicide) process as shown in FIG. 8.

Figure 9:
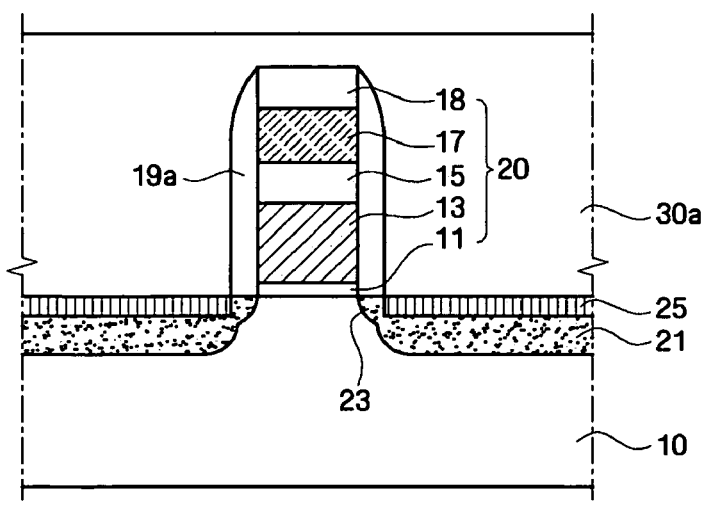
Figure 10:
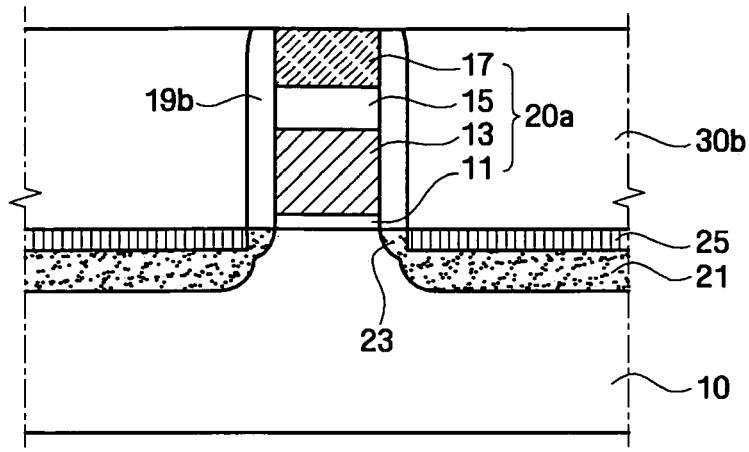

Referring to FIG. 9, an interlayer dielectric layer 30a is formed over the entire transistor area of the substrate 10 using, for example, silicon oxide ($SiO_2$) which may also be the same material used for the sidewall spacers 19a. The upper portion of the interdielectric layer 30a is then removed, along with the mask layer 18, and upper portions of the sidewall spacers 19a, through a process such as chemical mechanical polishing (CMP) to expose the polysilicon layer 17 as shown in FIG. 10.

Figure 11:
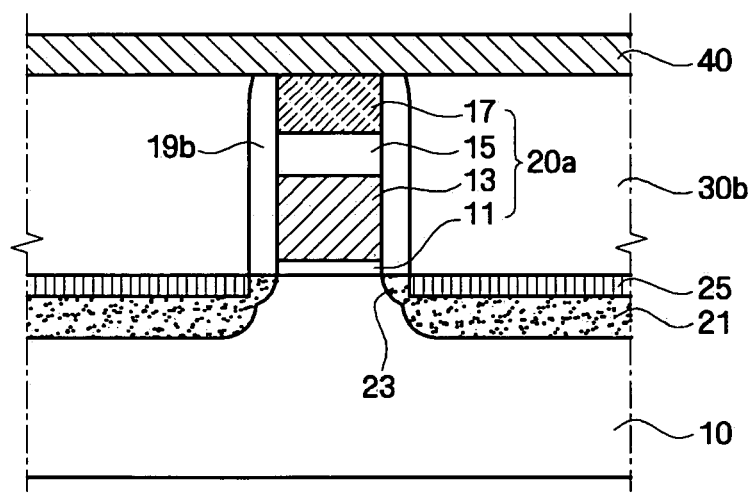
Figure 12:
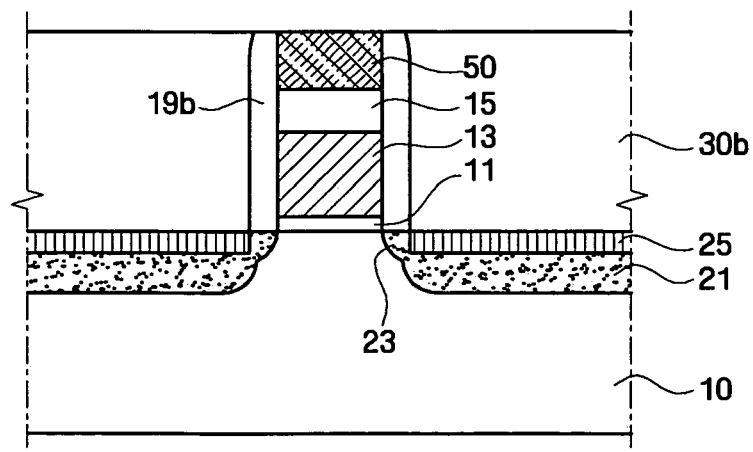

Referring to FIG. 11, a layer of metal 40 is formed over the exposed polysilicon layer 17, the remaining portion 30b of the interdielectric layer 30a, and the remaining portions 19b of the sidewall spacers. Examples of suitable metals include cobalt (Co), titanium (Ti), nickel (Ni), tungsten (W), tantalum (Ta), platinum (Pt), hafnium (Hf), molybdenum (Mo), etc. The entire structure is then thermally treated to cause the metal layer 40 to react with the polysilicon layer 17, thereby forming a metal silicide. The polysilicon layer 17 is preferably transformed completely into a metal silicide layer 50 as shown in FIG. 12. Unreacted metal is removed through any suitable process such as wet etching.

Figure 13:
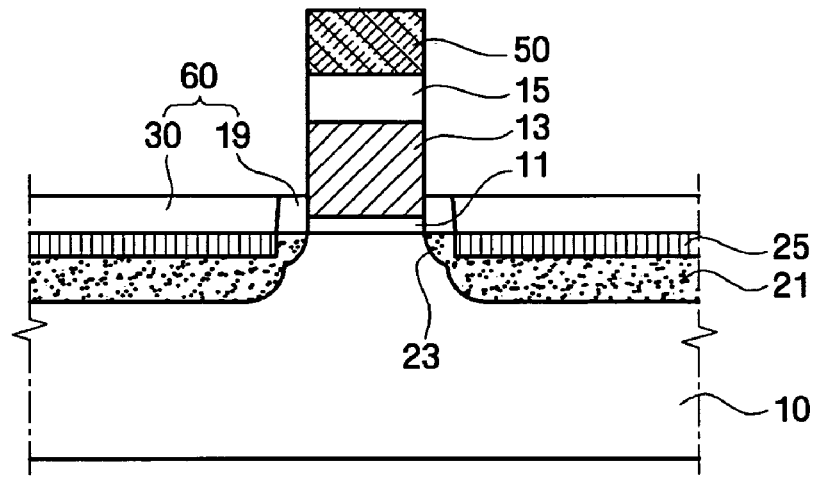

An additional portion of the interdielectric layer 30b is then removed, along with an additional portion of the sidewall spacers 19b, to expose the sidewalls of gate layer 13 as shown in FIG. 13. In this example, the gate layer 13 is exposed to more than one-half of its height. The portions of the interdielectric layer 30 and sidewall spacers 19 may be removed, for example, through wet and/or dry etching using the silicide layer 50 as a mask layer. The remaining portions of the interdielectric layer 30 and the sidewall spacers 19 form a second blocking layer 60, which in this embodiment, is preferably about 50~300 Å thick.

Figure 14:
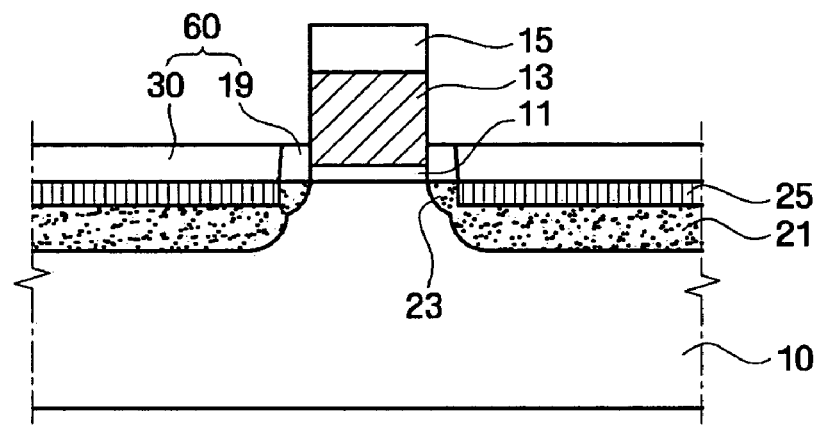

Referring to FIG. 14, the silicide mask layer 50 is removed using any suitable process such as etching.

Figure 15:
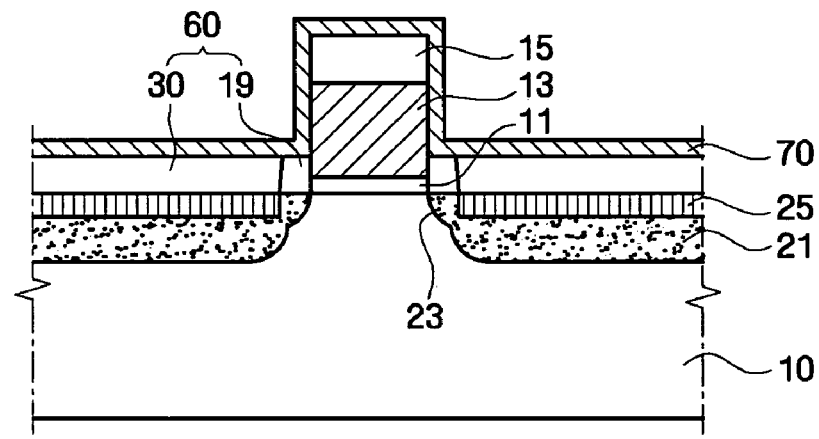

Referring to FIG. 15, a layer of metal 70 is formed over the exposed portions of the sidewalls of the gate layer 13, as well as other exposed surfaces such as the first blocking layer 15 and the second blocking layer 60. The metal layer may be formed, for example, from a refractory metal such as Ni, Co, Mo, Ti, Hf, Ta, W, Pt, or a combination thereof, but most preferably Ni or a combination containing Ni. The metal layer may be formed by any suitable deposition technique such as evaporation, sputter deposition, chemical vapor deposition (CVD), atomic layer deposition (ALD), etc.

Figure 16:
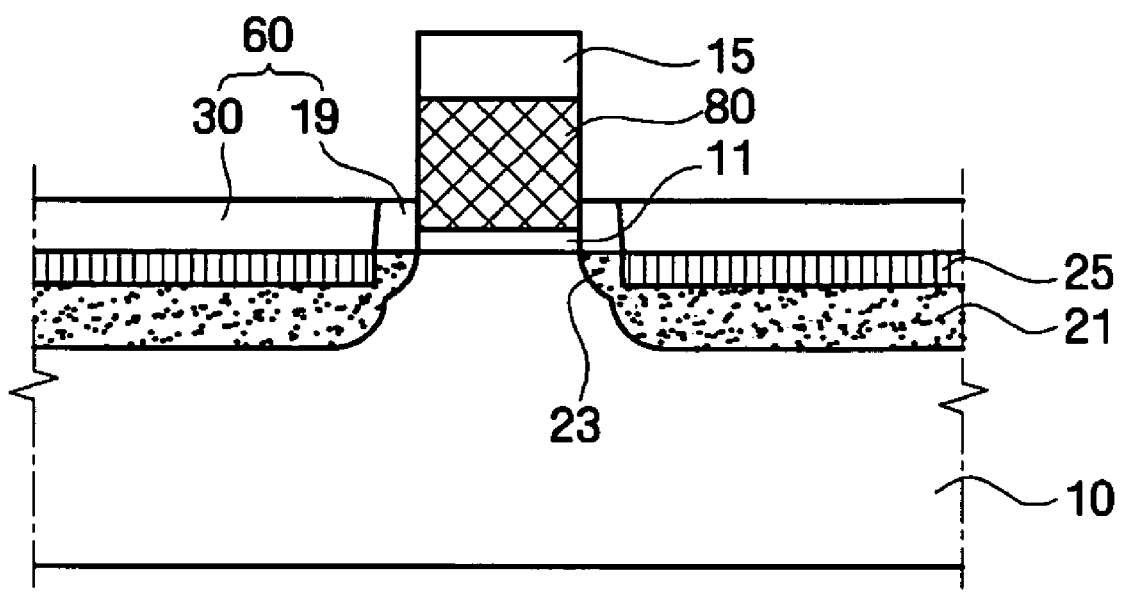

Another thermal treatment process is then performed to cause the metal layer 70 to react with the polysilicon gate layer 13, thereby siliciding the gate layer 13 through the sidewalls. The first blocking layer 15 prevents silicide formation through the top surface of the gate layer 13, while the second blocking layer 60 prevents silicide formation over the source and drain regions. Unreacted metal is again removed through any suitable process such as wet etching, thus leaving a silicided gate layer 80 as shown in FIG. 16.

By imparting an aspect of directional control to the silicide process, the inventive principles of this patent disclosure may provide enhanced control of the movement of the silicon-silicide interface as it progresses through the gate layer. Thus, in the embodiment described above, the process may produce a gate layer that is fully silicided, while avoiding some or all of the adverse results of prior art techniques such as rounded corners and surfaces, voids, etc.

The embodiments described above can be modified in arrangement and detail in accordance with the inventive concepts of this patent disclosure. For example, the gate material is not limited to polysilicon, and the various spacers, insulating layers, dielectric layers, etc., are not limited to any particular material. Likewise, other techniques for inhibiting or blocking silicidation through the top of the gate are possible in accordance with the inventive principles of this patent disclosure. Therefore, such changes and modifications are considered to fall within the scope of the following claims.

The invention claimed is:

1. A method comprising:
    forming a gate layer over a semiconductor substrate;
    forming a blocking layer to cover a top of the gate layer;
    exposing sidewalls of the gate layer; and
    siliciding the gate layer through the sidewalls of the gate layer;
    where the gate layer is substantially fully silicided by a single layer of metal; and
    where the blocking layer comprises silicon nitride.

2. The method of claim 1 where the blocking layer is formed to a thickness of about 300 to about 1000 angstroms.

3. The method of claim 1 where exposing sidewalls of the gate layer comprises exposing at least half of the height of the gate layer.

4. A method comprising:
    forming a gate layer over a semiconductor substrate;
    forming a blocking layer to cover a top of the gate layer;
    exposing sidewalls of the gate layer; and
    siliciding the gate layer through the sidewalls of the gate layer;
    where exposing the sidewalls comprises:
        forming a suicide layer over the blocking layer; and
        using the silicide layer as an etching mask.

5. The method of claim 4 where forming the silicide layer over the blocking layer comprises:
   forming a polysilicon layer over the blocking layer; and
   siliciding the polysilicon layer.

6. The method of claim 5 where the blocking layer comprises silicon nitride.

7. A method comprising:
   forming a gate layer over a semiconductor substrate;
   forming a blocking layer to cover a top of the gate layer;
   exposing sidewalls of the gate layer;
   siliciding the gate layer through the sidewalls of the gate layer;
   forming active regions in the semiconductor substrate at either side of the gate structure; and
   forming a second blocking layer over the active regions;
   where the gate layer is substantially fully silicided by a single layer of metal.

8. The method of claim 7 where forming the second blocking layer comprises:
   forming spacers on sidewalls of the gate layer;
   forming an interdielectric layer over the active regions; and
   etching a portion of the spacers and interdielectric layer.

9. A method comprising:
   forming a gate layer over a semiconductor substrate;
   forming a blocking layer to cover a top of the gate layer;
   exposing sidewalls of the gate layer; and
   siliciding the gate layer through the sidewalls of the gate layer;
   where the gate layer is substantially fully silicided by a single layer of metal; and
   where siliciding the gate layer through the sidewalls of the gate layer comprises:
   forming a metal layer over the blocking layer and exposed sidewalls of the gate layer; and
   thermally treating the gate layer and the metal layer.

10. The method of claim 9 where the metal layer comprises nickel.

11. A method comprising:
    forming a gate layer over a channel region for a transistor;
    siliciding the gate layer through sidewalls of the gate layer; and
    preventing silicidation through a top of the gate layer;
    where the gate layer is substantially fully silicided by a single layer of metal.

12. The method of claim 11 where limiting silicidation through the top of the gate layer comprises forming a blocking layer over the gate layer.

13. The method of claim 12 where the blocking layer comprises silicon nitride.

14. The method of claim 13 where the blocking layer is formed to a thickness of about 300 to about 1000 angstroms.

15. A method comprising:
    forming a gate layer over a channel region for a transistor;
    siliciding the gate layer through sidewalls of the gate layer;
    limiting silicidation through a top of the gate layer, including forming a blocking layer over the gate layer; and
    forming a silicide layer over the blocking layer.

16. The method of claim 15 further comprising using the silicide layer as an etching mask to expose the sidewalls of the gate layer.

17. The method of claim 15 where forming the suicide layer over the blocking layer comprises:
    forming a polysilicon layer over the blocking layer; and
    siliciding the polysilicon layer.

18. A method for forming a gate structure comprising:
    a step for forming a gate layer over a semiconductor substrate;
    a step for siliciding the gate layer; and
    a step for preventing siliciding at the top of the gate layer;
    where the gate layer is substantially fully silicided by a single layer of metal.

19. The method of claim 18 where the step for siliciding the gate layer comprises a step for siliciding the gate layer through sidewalls of the gate layer.

20. The method of claim 18 where the step for preventing siliciding at the top of the gate layer comprises a step for blocking a metal layer from contacting the top of the gate layer.

21. The method of claim 20 where the step for blocking a metal layer from contacting the top of the gate layer comprises forming a blocking layer over the gate layer.

22. A method for forming a gate structure comprising:
    a step for forming a gate layer over a semiconductor substrate;
    a step for siliciding the gate layer;
    a step for preventing siliciding at the top of the gate layer, including forming a blocking layer over the gate layer; and
    a step for forming a silicide layer over the blocking layer.

23. The method of claim 22 further comprising a step for exposing sidewalls of the spacer.

* * * * *

UNITED STATES PATENT AND TRADEMARK OFFICE
CERTIFICATE OF CORRECTION

PATENT NO. : 7,560,331 B2
APPLICATION NO. : 11/354748
DATED : July 14, 2009
INVENTOR(S) : Hyun-Su Kim et al.

It is certified that error appears in the above-identified patent and that said Letters Patent is hereby corrected as shown below:

Column 4, line 66, the word "suicide" should read -- silicide --;
Column 6, line 14, the word "suicide" should read -- silicide --.

Signed and Sealed this

Third Day of November, 2009

David J. Kappos
*Director of the United States Patent and Trademark Office*